US006398937B1

(12) United States Patent
Menini et al.

(10) Patent No.: US 6,398,937 B1
(45) Date of Patent: Jun. 4, 2002

(54) ULTRASONICALLY ASSISTED PLATING BATH FOR VIAS METALLIZATION IN PRINTED CIRCUIT BOARD MANUFACTURING

(75) Inventors: Richard Menini, Boucherville; Joel Fournier, Montreal, both of (CA)

(73) Assignee: National Research Council of Canada, Boucherville (CA)

( * ) Notice: Subject to any disclaimer, the term of this patent is extended or adjusted under 35 U.S.C. 154(b) by 0 days.

(21) Appl. No.: 09/653,798

(22) Filed: Sep. 1, 2000

(51) Int. Cl.[7] ............................................. H01L 21/463
(52) U.S. Cl. ....................... 205/125; 205/291
(58) Field of Search .................................. 205/125, 291

(56) References Cited

U.S. PATENT DOCUMENTS 6,159,853 A * 12/2000 Lai ............................. 438/676

OTHER PUBLICATIONS

Hsiao et al., "The effect of ultrasonic agitation on copper plating in an acid bath" Mar. 1989, Plating and surface finishing, pp. 46–50.*

Yu. V. Seryanov, L.M. Kvyatkovskaya and V.A. Grishanin, Optimization of Ultrasonic Electrodeposition of Tin–BIsmuth Alloy in Channels of Narrow Commutation Holes in Integrated Circuits, ProSecution Metals, vol. 29, No. 6, 1993, No Month.

Yu. V. Seryanov, L.M. Kvyatkovskaya and V.A. Grishanin, Ultrasonic Nickel Electrodeposition in the Channels of Narrow Holes in Integrated Circuits, Protection in Metals, vol. 30, No. 3, 1994, pp. 333–336, No Month.

Yu. V. Seryanov, L.M. Kvyatkovskaya and V.A. Grishanin, Optimization of Ultrasonic Copper Electro–deposition in the Narrow Channels of Via–Holes in Integrated Circuits, Protection of Metals, Vo. 30, No. 3, 1994, pp. 284–286, No Month.

M.C. Hsiao and C.C. Wan, The Effect of Ultrasonic Agitation on Copper Plating in an Acid Bath, Mar. 1989, pp. 46–50.

Elzbieta Ratajewixa–Mikolajczak, Artificial Neural Network Approach to Mixed Boundary Conditions Identification, Archives of Electrical Engineering, vol. XL VII, No. 1, 1998, pp. 3–11, No Month.

Poster Presentation entitled Acid Copper Plating for Printed Circuit Board Interconnections; Richard Menini, Joël Fournier and Yves Michel Henuset; Sep. 5 –10, 1999.

* cited by examiner

*Primary Examiner*—Arun S. Phasge
(74) *Attorney, Agent, or Firm*—Paul S. Sharpe; Marks & Clerk (57) ABSTRACT

A method and apparatus for enhancing the microthrowing power in a plating bath. The method involves the use of ultrasonic vibration of an electrochemical solution to increase the uniformity of copper deposition for blind hole vias. The apparatus includes a series of ultrasonic transducers positioned between anodes for vibration of the solution being electro deposited on the cathode.

18 Claims, 8 Drawing Sheets

☐ : $d = 190$ microns, $AR = 1.15$
○ : $d = 140$ microns, $AR = 1.15$
△ : $d = 190$ microns, $AR = 0.8$

Fig. 4

■ : $d$ = 190 microns, $AR$ = 1.15
● : $d$ = 140 microns, $AR$ = 1.15
▲ : $d$ = 190 microns, $AR$ = 0.8

Fig. 5

□ : $d = 100$ microns, $AR = 1.9$
○ : $d = 100$ microns, $AR = 2.4$

□ : $d = 150$ microns, $AR = 1.25$
○ : $d = 150$ microns, $AR = 1.5$

Fig. 8

■ : $d$ = 150 microns, $AR$ = 1.25
● : $d$ = 150 microns, $AR$ = 1.5

ULTRASONICALLY ASSISTED PLATING BATH FOR VIAS METALLIZATION IN PRINTED CIRCUIT BOARD MANUFACTURING

FIELD OF THE INVENTION

The present invention relates to vias metallization of printed circuit boards and more particularly, the present invention relates to enhancing the throwing power in the electroplating of the vias.

BACKGROUND OF THE INVENTION

In view of the continuous advancements in semiconductor performance together with rapid expansion of the demand for sophisticated electronic devices, particularly in mobile and portable applications, the need for fabricating circuit feature of a small size and interconnection substrates is substantially increasing. Multi-layered printed circuit boards are now using high aspect ratio through hole vias and blind vias openings for high density interconnections. Uniform plating distribution inside these vias represents a main issue for PCB reliability.

New ways to improve mass transport and new electrolyte additives have increased the uniformity of electrodeposition inside blind vias.

Blind vias having a diameter (d) of 150 microns or less and an aspect ratio (AR) (see equation [1]) greater than 1 are difficult to plate properly using conventional techniques. Currently, in order to enhance copper deposition inside blind vias, the technique of reverse pulse plating or the use of complex chemical solutions have been proposed and used. These processes are not without their limitations, despite the fact that they are useful. As is known, industrial plating solutions can be extremely complex and can contain up to four organic additives. Additive concentrations require constant monitoring and are usually adjusted because many of these additives are destroyed or sacrificed during the plating process. Another limitation is that the solution, subsequent to use is environmentally unfriendly and can result in expensive disposal costs.

Regarding a pulse step position, this process also employs complex chemical solutions and involves a significant capital investment since the method does not employ the same current rectifiers typically associated with conventional DC plating. One of the other limitations to this process is that health problems could be an issue for the operators since reverse pulse systems emit strong magnetic fields.

As is known in fluid dynamics, ultrasonic agitation enhances mass transfer and this technique can be applied to electrochemistry. This was proposed by Walker in, Chemistry in Britain, 1990, pp. 251–254.

Although there have been advances in the electroplating of the circuit board vias, these methods remain complex to control and run. There is a need in the industry to have a method which is easier to operate and which provides for a similar or more efficient electrodeposition. The present invention satisfies these needs.

SUMMARY OF THE INVENTION

One object of the present invention is to provide an improved system and method for enhancing the throwing power in an electroplating cell.

The method is particularly well adapted for industrial applications of PCB plating for high production levels with uniform application of the plating material.

According to a further object of one embodiment, there is provided a method for electroplating blind vias or through holes in a printed circuit comprising the steps of: providing a printed circuit board having blind vias or through holes therein; providing a plating cell containing solution for plating in the vias of the printed circuit board, the plating cell further including anodes; providing ultrasonic vibration means for vibrating the plating solution during electrodeposition; and vibrating the solution to electroplate the blind vias or through holes.

It has been found that ultrasonic agitation in accordance with the present invention substantially increased the microthrowing power improvement for small interconnection blind vias.

The ultrasonic treatment may occur using transducers operating in the range of 20 kHz to 60 kHz suitably positioned within the plating bath. For purposes of the instant application, copper electrodeposition was employed and to this end the transducers were positioned within titanium hollow containers in view of the fact that the containers are chemically inert, under certain conditions, to the plating bath and do not interfere with the electroplating procedure. It will be appreciated by those skilled in the art that the container may comprise any suitable material and this will depend on the environment in which the transducers are employed and the nature of the compounds in the solution.

It is envisioned that the ultrasonic transducers are positioned directly within the cell at a suitable location to induce hydrodynamic cavitation within the cell and thus increase the uniformity of deposition within the blind vias. To augment the electrodeposition efficiency, chemical additives may be used in combination with the ultrasonic agitation. Suitable additives are known to those skilled in the art.

Other known methods may be combined with the ultrasonic treatment of the solution such as agitation of the PCB board or substrate to be treated in addition to the ultrasonic treatment of the solution. Further, it is clearly envisioned that other forms of treatment including reverse pulse deposition could also be used in combination with the ultrasound treatment.

Another object of one embodiment of the invention is to provide a method of plating blind vias in integrated circuits, comprising the steps of: providing a printed circuit board to be plated; providing a plating cell containing solution for plating in the blind vias or through holes of the printed circuit board, the cell further including anodes; providing ultrasonic vibration means for vibrating the plating solution during electrodeposition; introducing a gas adjacent the printed circuit board for localized agitation of the plating solution around the printed circuit board; and vibrating the solution to electroplate the blind vias or through holes.

According to a further object of one embodiment of the present invention, there is provided a system for electroplating vias in a printed circuit board, the system comprising: an electroplating cell having a pair of anodes; means for supplying power to the cell; an electrochemical solution; a substrate for receiving material to be electroplated; and ultrasonic vibration means for vibrating the solution.

Having thus described the invention, reference will now be made to the accompanying drawings illustrating preferred embodiments.

DETAILED DESCRIPTION OF THE PREFERRED EMBODIMENTS

Figure 1:
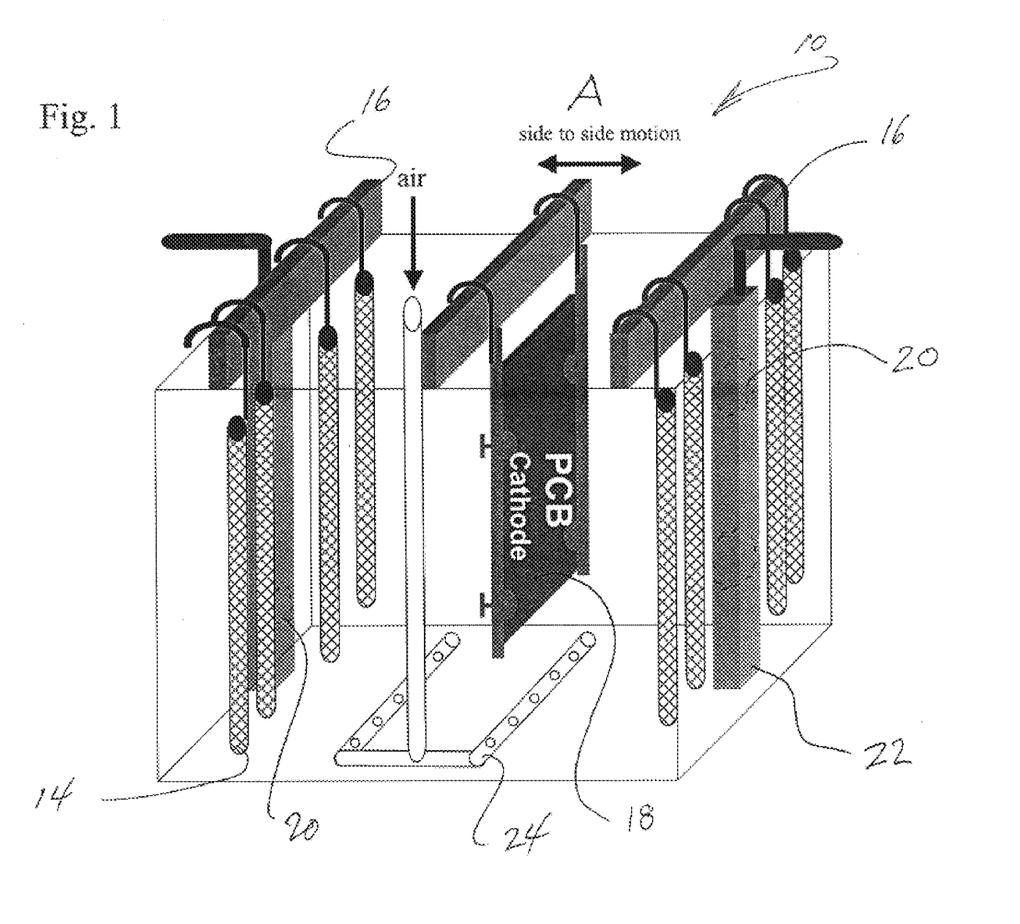
FIG. 1 is a schematic illustration of the plating bath system in accordance with one embodiment of the present invention.

Referring now to FIG. 1, shown is a schematic illustration of the plating bath according to one embodiment, with the cell being globally referenced by numeral 10. The cell includes a reaction vessel 12 within which an electrochemical solution is known to be included, the solution not being shown. The cell includes a plurality of anodes 14 which are suitably connected to a bus bar 16 with the bus being connected to suitable source of power (not shown). The cathode, shown in the example as the substrate 18 is disposed in the cell 10 as indicated in FIG. 1. In this example, the substrate comprises a PCB having a blind vias openings (not shown) and other small features.

In the embodiment of FIG. 1, the ultrasonic transducers 20 (dashed lines) are positioned within hollow containers 22 which, in the example, comprise polygonal titanium containers. Since the plating bath comprises a conventional DC copper bath, the titanium container was selected in view of the chemical inertness in this system. Other variations for the material of which the container is made will depend on the nature of the solution and the overall cell. To augment deposition, an apertured air hose 24 is connected to a source of pressurized gas (not shown) such as air, nitrogen, noble gases etc. The gas is bubbled in the solution to cause localized agitation of the solution at the cathode 18. Further, the cathode 18 may be moved relative to vessel 12 laterally in the direction of arrow A to further assist in deposition. This may be moved manually or mechanically.

The titanium containers include a plurality of ultrasonic transducers 20 as indicated with the total power for a single container comprising 500 watts at between 20 kHz and 60 kHz and preferably 40 kHz operating frequency. The two cans employed were inserted between and behind two pairs of anodes 14 as illustrated in FIG. 1 in 600 L of copper plating bath. The cathode consisted of a blind vias drilled test panel of a printed circuit board.

Figure 2:
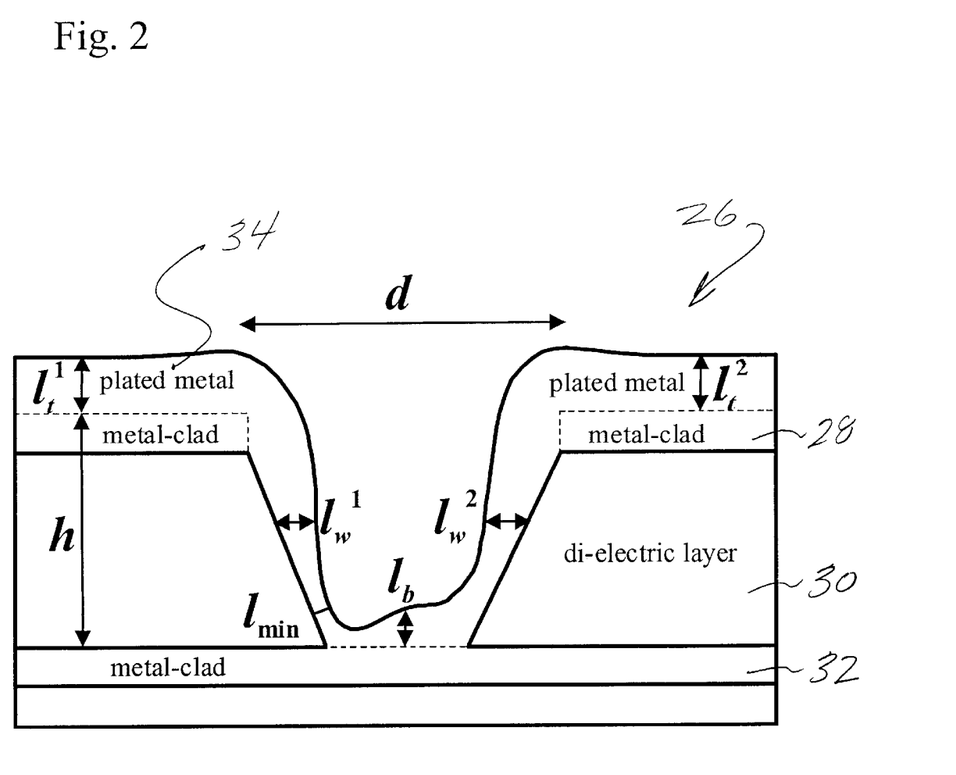
FIG. 2 is a schematic cross-sectional illustration of a blind via feature.

With reference to FIG. 2, shown is a schematic cross-sectional illustration blind via feature. The feature is denoted by numeral 26 and includes a metal clad layer 28, a dielectric layer 30, a second metal clad layer 32 positioned beneath layer 30 and a plated metal layer broadly denoted by 34. With respect to the symbology used in FIG. 2, the following is representative of the physical meaning and value/units of the symbols used in FIG. 2:

| Symbol | Physical Meaning | Value and/or Units |
|---|---|---|
| AR | Blind via aspect ratio | — |
| d | Blind via diameter | $\mu m$ |
| h | Blind via depth | $\mu m$ |
| $I_b$ | Copper blind via bottom thickness | $\mu m$ |
| $I_{min}$ | Minimum copper blind vias thickness | $\mu m$ |
| $I_t^1$ and $I_t^2$ | Surface copper thickness | $\mu m$ |
| $I_w^1$ and $I_w^2$ | Copper blind via wall thickness | $\mu m$ |
| $P_1$ | Mean microthrowing power parameter | % |
| $P_2$ | Mean deposit quality parameter | % |

In order to calculate the points for the graphical illustrations to be discussed hereinafter, the following formula were used:

$$[1] \quad AR = \frac{h}{d}$$

$$[2] \quad P_1 = \frac{2}{3} \frac{(l_w^1 + l_w^2 + l_b)}{(l_t^1 + l_t^2)} \times 100$$

$$[3] \quad P_2 = \frac{3 l_{min}}{(l_w^1 + l_w^2 + l_b)} \times 100$$

Regarding FIGS. 3 through 8, Table 1 represents the experimental conditions used to generate the data points.

TABLE 1

| Experiment | Air Agitation | Ultrasonic Agitation (W.cm$^{-2}$) | Current Density (A.dm$^{-2}$) |
|---|---|---|---|
| A | Yes | No | 2.2 |
| B | No | 0.093 | 2.2 |
| C | No | 0.19 | 2.2 |
| D | Yes | 0.093 | 2.2 |
| E | Yes | 0.19 | 2.2 |
| F | Yes | No | 1.65 |
| G | Yes | 0.045 | 1.65 |
| H | Yes | 0.093 | 1.65 |
| I | Yes | 0.19 | 1.65 |
| J | Yes | 0.045 | 2.2 |

For the data in FIGS. 3 through 8, a plating time corresponding to a 25 micron deposit thickness and a side-to-side motion of the PCB were used. These two conditions together with air agitation are representative of conventional conditions used in the PCB plating industry. All of the lengths ($I_x$) were evaluated using cross-sectional samples taken at different locations on the PCB. High $P_1$ values are indicative of uniformity in the deposit while high $P_2$ are representative of the absence of defects in the deposits.

Figure 3:
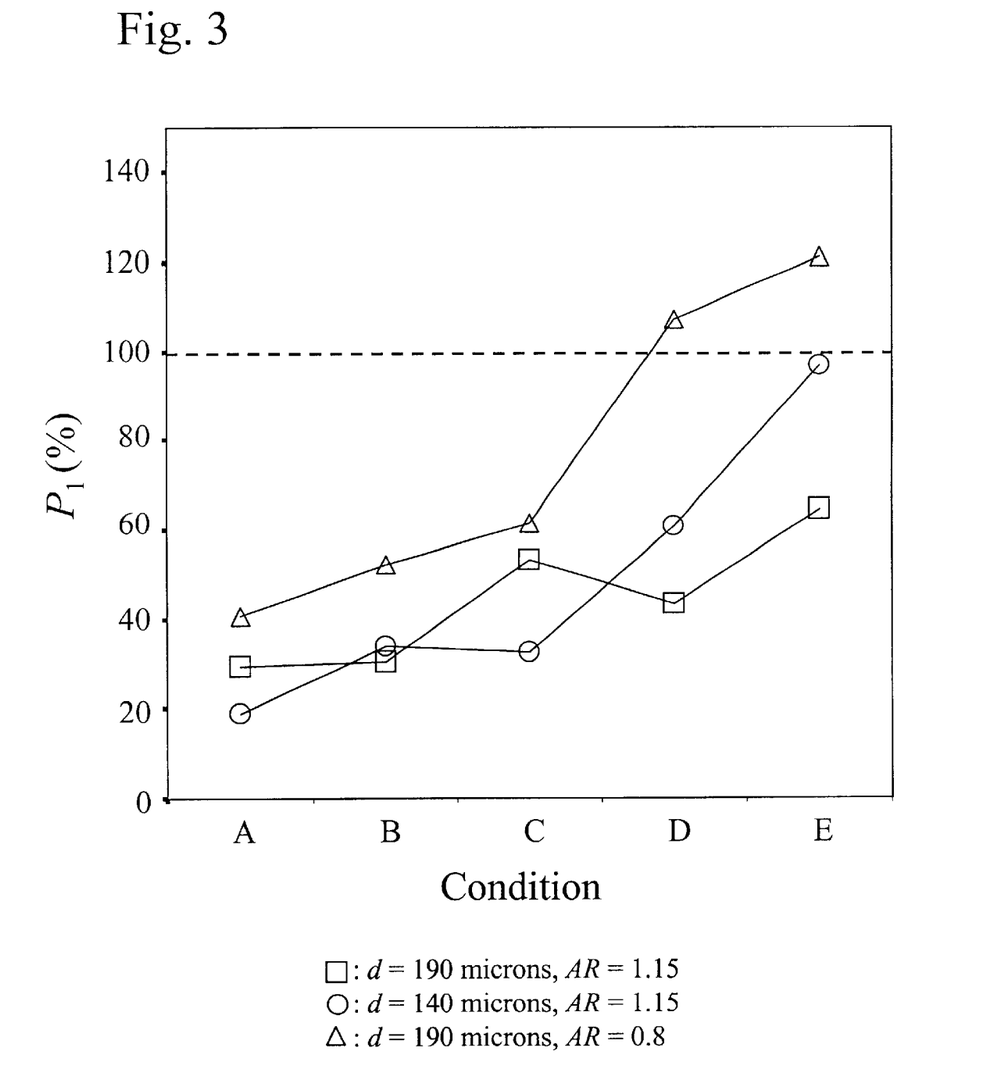
FIG. 3 is a graphical illustration of the variation in mean microthrowing parameters as a function of plating conditions for different vias sizes.
Figure 4:
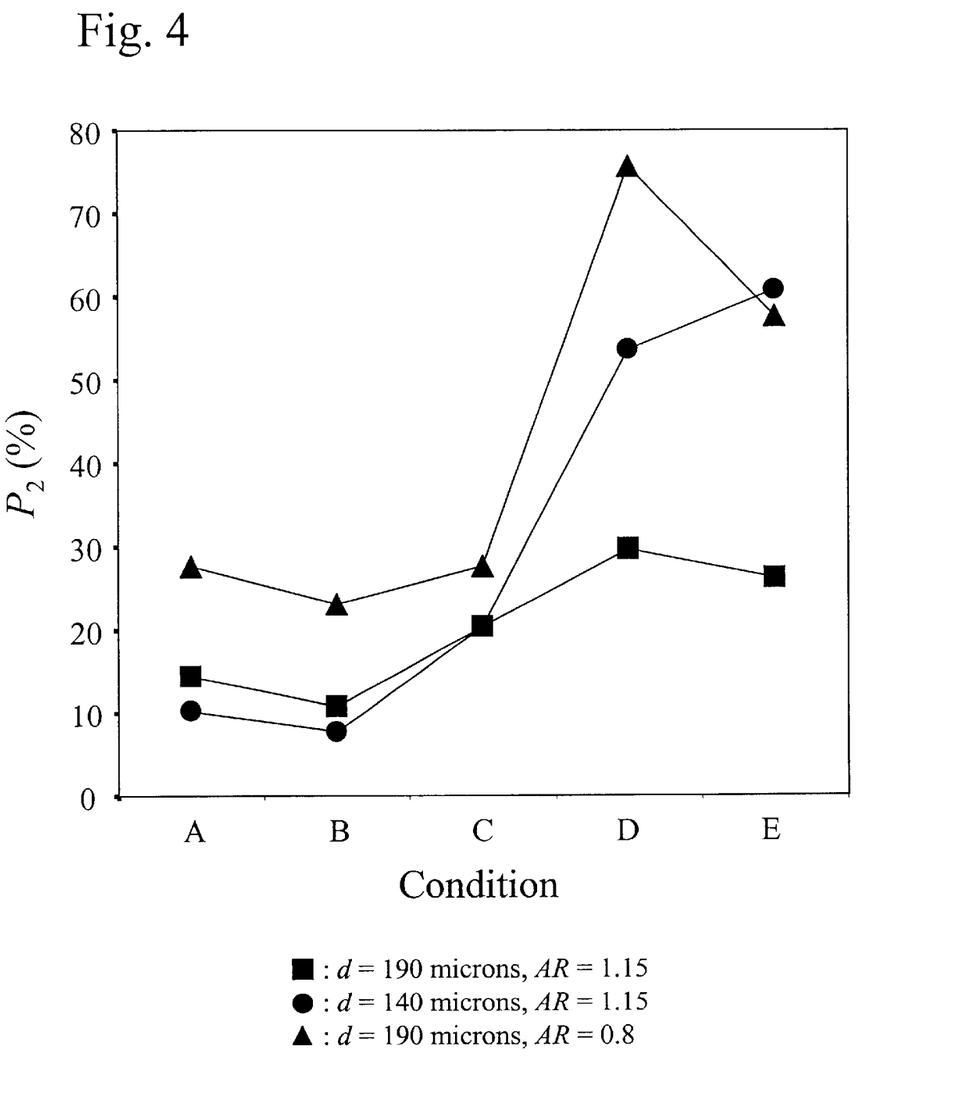
FIG. 4 is a graphical illustration of the variation of the mean deposit quality parameters as a function of plating conditions for different vias sizes.

The results shown in FIGS. 3 and 4 demonstrate that the combination of air and ultrasonic agitation (condition D and E) were crucial and yielded high $P_1$ and $P_2$ relative to conditions A through C. It was determined that ultrasonic agitation in the absence of air agitation was not sufficient.

With respect to FIGS. 5 through 8, experimentation involved the combined effect of air and ultrasonic agitation with the exception of condition F (air agitation only).

From an analysis of FIGS. 3 through 8 significant improvements in both $P_1$ and $P_2$ values were obtained when using the combination of air and ultrasonic agitation relative to those results from condition F. This was found particularly valid when small apertures with high aspect ratios were plated. High aspect ratio data is provided in FIGS. 5 and 6.

Figure 5:
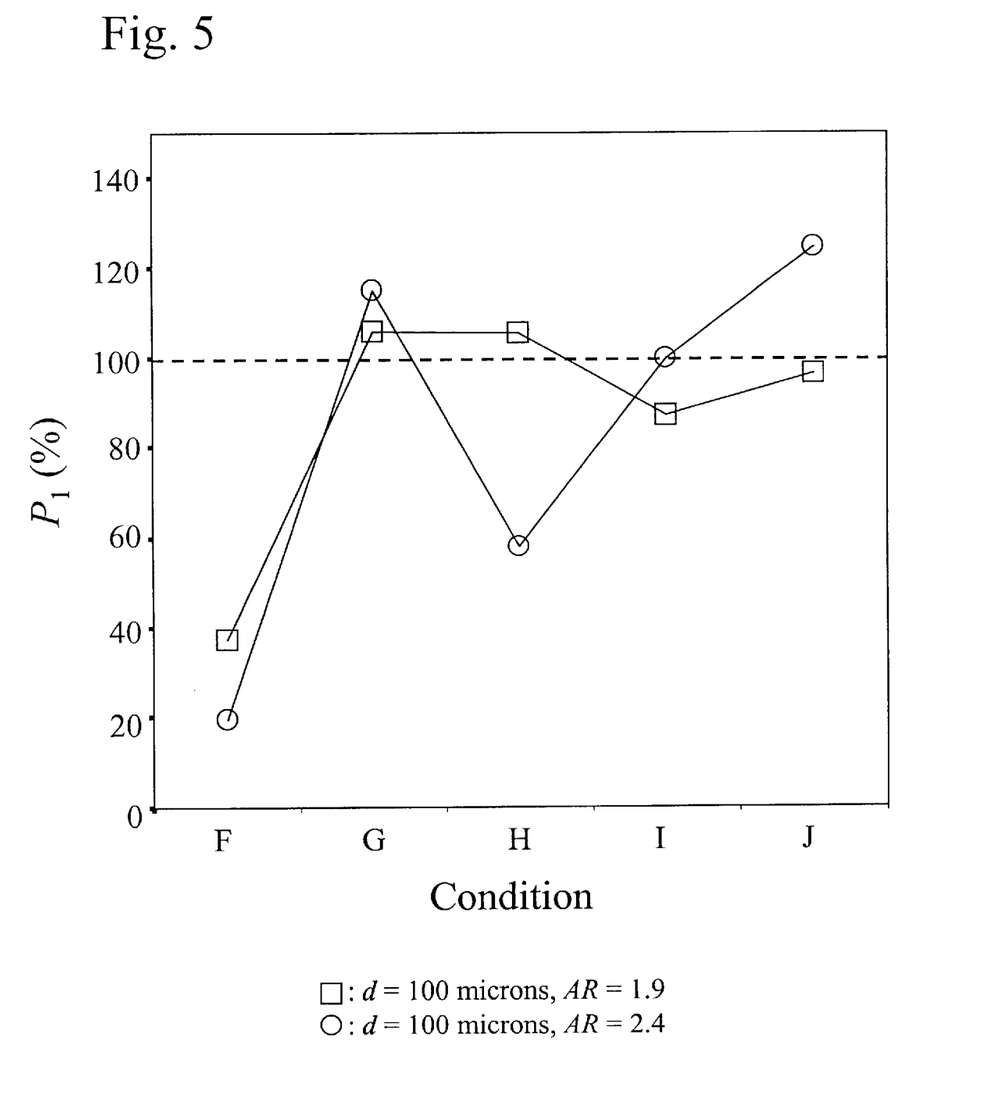
FIG. 5 is a graphical illustration similar to FIG. 3 for further vias sizes.
Figure 6:
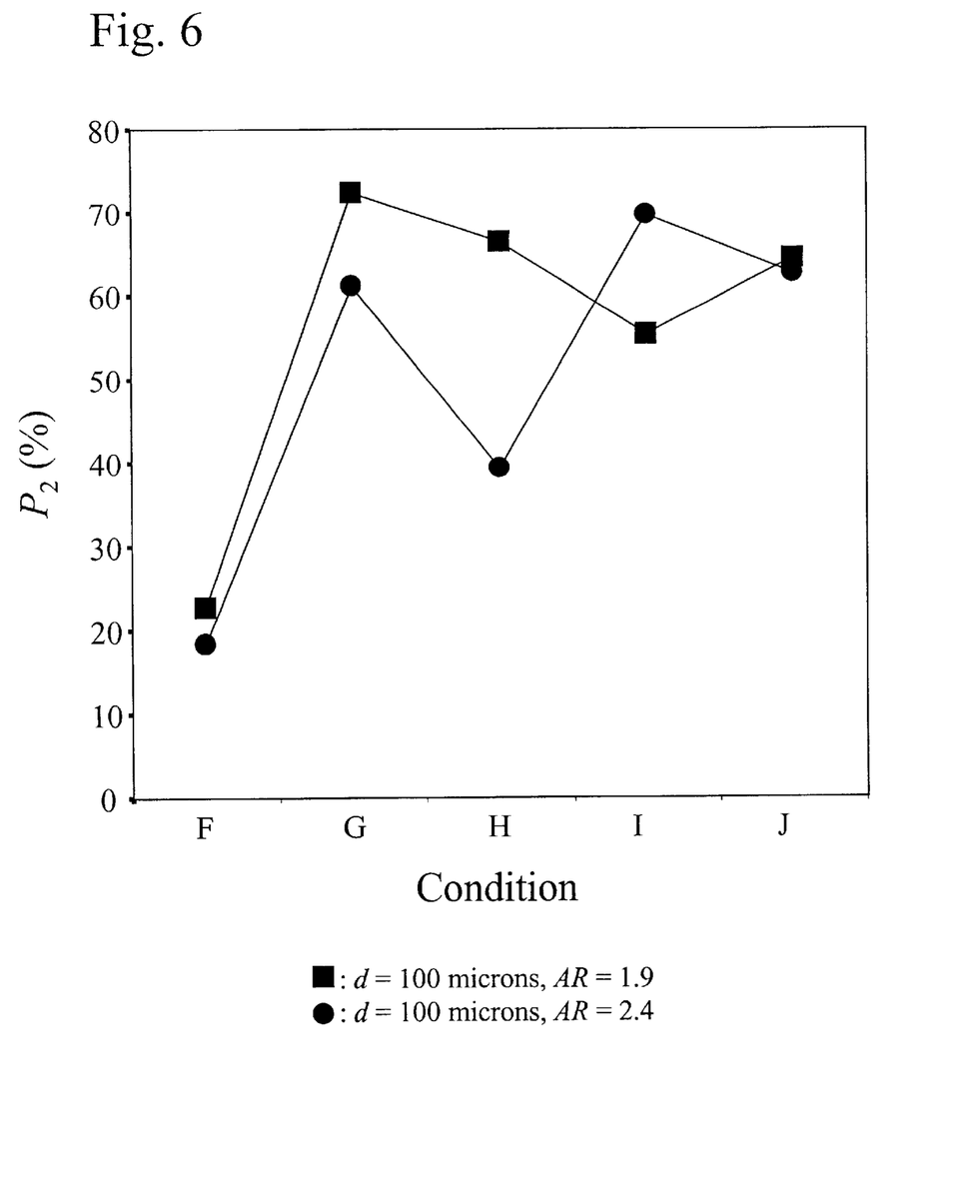
FIG. 6 is a graphical illustration similar to FIG. 4 for further vias sizes.
Figure 7:
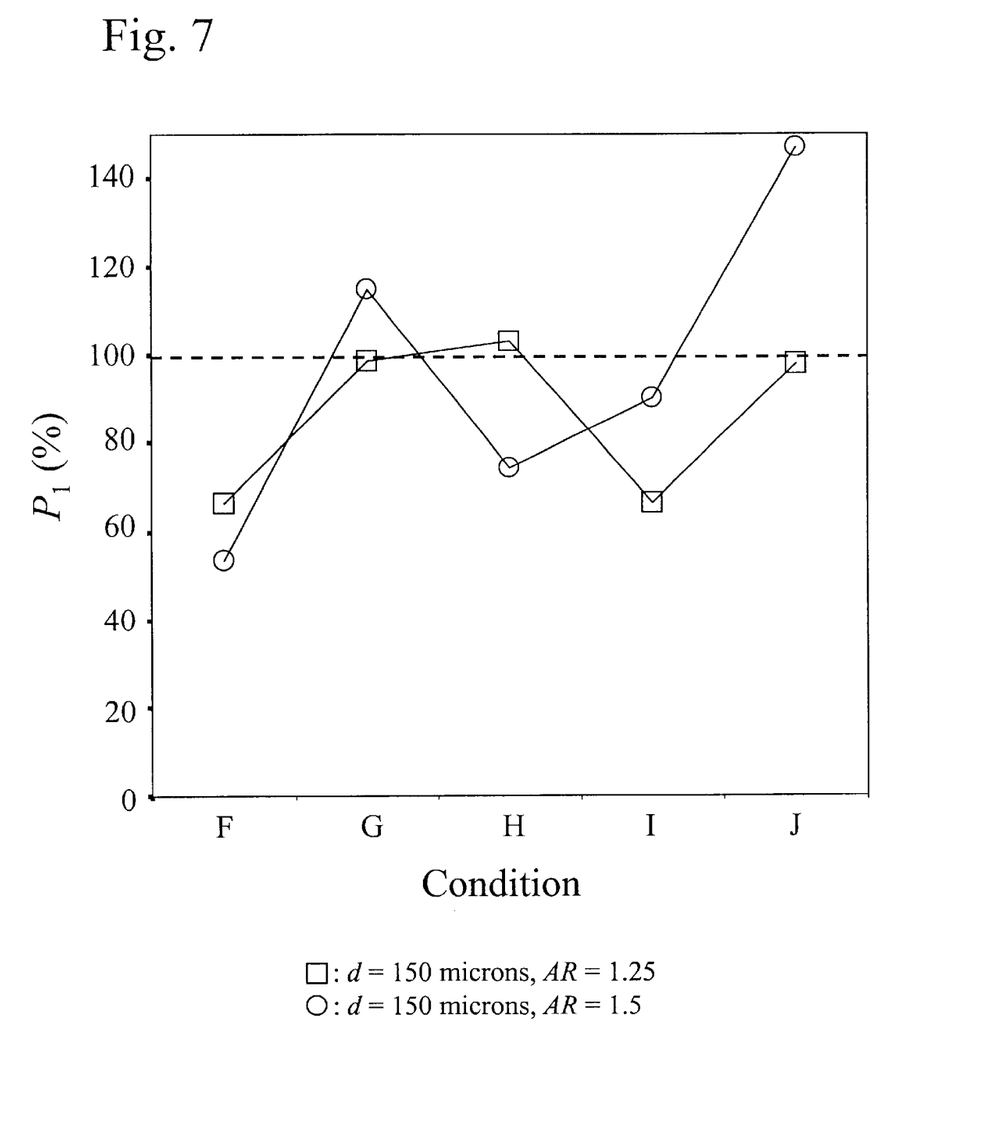
FIG. 7 is a graphical illustration similar to FIGS. 3 and 5 for different vias.
Figure 8:
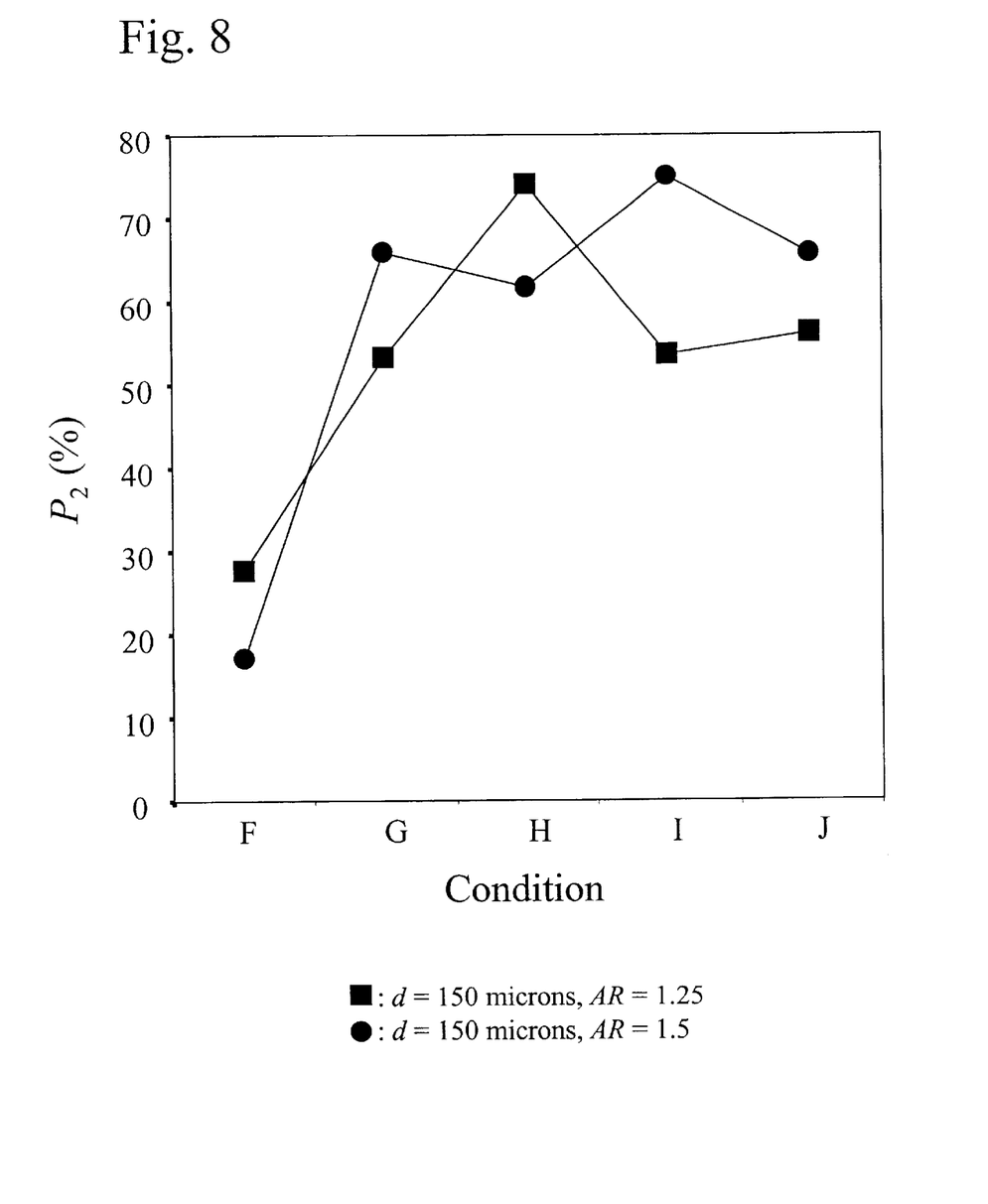
FIG. 8 is a graphical illustration similar to FIGS. 4 and 6.

With reference to the combination of FIGS. 3, 5 and 7, $P_1$ were noted to approach and in some instances exceed the 100% level therefore demonstrating the efficiency of the instant process.

Although embodiments of the invention have been described above, it is not limited thereto and it will be apparent to those skilled in the art that numerous modifications form part of the present invention insofar as they do not depart from the spirit, nature and scope of the claimed and described invention.

We claim:

1. A method of plating blind vias in printed circuits, comprising the steps of:

provided a printed circuit board to be plated;

providing a plating cell containing solution for plating in said blind vias or through holes of said printed circuit board, said cell further including anodes;

providing ultrasonic vibration means for vibrating said plating solution during electrodeposition;

introducing a gas adjacent said printed circuit board for localized agitation of the plating solution around the printed circuit board; and vibrating said solution to electroplate said blind vias or through holes.

2. The method as set forth in claim 1, wherein said gas comprises air.

3. The method as set forth in claim 2, wherein said gas is introduced in said solution under said printed circuit board.

4. The method as set forth in claim 1, further including the step of moving said printed circuit board during plating.

5. The method as set forth in claim 1, further including the step of positioning said ultrasonic vibration means within said plating bath.

6. The method as set forth in claim 1, further including the step of enclosing said ultrasonic vibration means within a chemically inert container in said cell.

7. The method as set forth in claim 1, further including the step of moving said printed circuit board during plating.

8. The method as set forth in claim 1, wherein said ultrasonic vibration means has a signal of between 20 kHz and 60 kHz.

9. A system for electroplating vias in a printed circuit board, said system comprising:

an electroplating cell having a pair of anodes;

means for supplying power to said cell;

an electrochemical solution;

means for introducing a gas into soil solution;

a substrate for receiving material to be electroplated; and ultrasonic vibration means for vibrating said solution.

10. The apparatus as set forth in claim 9, wherein said substrate comprises a printed circuit board having blind vias or through holes.

11. The apparatus as set forth in claim 9, wherein said ultrasonic vibration means comprises at least a pair of ultrasonic transducers.

12. The apparatus as set forth in claim 11, wherein said apparatus includes a hollow container for retaining said transducers.

13. The apparatus as set forth in claim 12, wherein said hollow container comprises a titanium cylinder.

14. The apparatus as set forth in claim 9, wherein said cell is a copper electroplating cell.

15. The apparatus as set forth in claim 14, wherein said blind vias have a diameter of 150 microns or less.

16. The apparatus as set forth in claim 15, wherein said blind vias have an aspect ratio of greater than 1.

17. The apparatus as set forth in claim 9, wherein said means for introducing a gas into said solution comprises an apertured tube.

18. The apparatus as set forth in claim 17, wherein said gas comprises air.

* * * * *